(12) United States Patent
Albers et al.

(10) Patent No.: US 9,653,439 B2
(45) Date of Patent: May 16, 2017

(54) THREE DIMENSIONAL STRUCTURES WITHIN MOLD COMPOUND

(71) Applicant: Intel Corporation, Santa Clara, CA (US)

(72) Inventors: Sven Albers, Regensburg (DE); Andreas Wolter, Regensburg (DE); Klaus Reingruber, Langquaid (DE); Thorsten Meyer, Regensburg (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/778,036

(22) PCT Filed: Dec. 9, 2014

(86) PCT No.: PCT/US2014/069361
§ 371 (c)(1),
(2) Date: Sep. 17, 2015

(87) PCT Pub. No.: WO2016/093808
PCT Pub. Date: Jun. 16, 2016

(65) Prior Publication Data
US 2016/0358897 A1 Dec. 8, 2016

(51) Int. Cl.
*H01L 25/16* (2006.01)
*H01L 21/50* (2006.01)
(Continued)

(52) U.S. Cl.
CPC .......... *H01L 25/16* (2013.01); *H01L 21/568* (2013.01); *H01L 21/6835* (2013.01);
(Continued)

(58) Field of Classification Search
CPC .......... H01L 25/50; H01L 25/16; H01L 21/50
See application file for complete search history.

(56) References Cited

U.S. PATENT DOCUMENTS 5,554,336 A * 9/1996 Hull ...................... G03F 7/0037
118/423
5,643,804 A * 7/1997 Arai ........................ H01L 25/16
257/E21.413
(Continued)

FOREIGN PATENT DOCUMENTS

DE 102013010228 3/2014
JP 2009099752 5/2009

OTHER PUBLICATIONS

Intel Corporation, "Office action with search report", TW Application No. 104133711, (Aug. 22, 2016).
(Continued)

*Primary Examiner* — Evan Pert
(74) *Attorney, Agent, or Firm* — Blakely, Sokoloff, Taylor & Zafman LLP

(57) ABSTRACT

A method including forming at least one passive structure on a substrate by a build-up process; introducing one or more integrated circuit chips on the substrate; and introducing a molding compound on the at least one passive structure and the one or more integrated circuit chips. A method including forming at least one passive structure on a substrate by a three-dimensional printing process; introducing one or more integrated circuit chips on the substrate; and embedding the at least one passive structure and the one or more integrated circuit chips in a molding compound. An apparatus including a package substrate including at least one three-dimensional printed passive structure and one or more integrated circuit chips embedded in a molding material.

20 Claims, 10 Drawing Sheets

(51) Int. Cl.
*H01L 25/00* (2006.01)
*H01L 23/48* (2006.01)
*H01L 21/56* (2006.01)
*H01L 23/00* (2006.01)
*H01L 25/065* (2006.01)
*H01L 25/07* (2006.01)
*H01L 23/31* (2006.01)
*H01L 21/683* (2006.01)
*H01L 23/498* (2006.01)
*H01L 49/02* (2006.01)

(52) U.S. Cl.
CPC .......... *H01L 23/3128* (2013.01); *H01L 23/48* (2013.01); *H01L 23/49816* (2013.01); *H01L 24/19* (2013.01); *H01L 24/20* (2013.01); *H01L 24/96* (2013.01); *H01L 25/065* (2013.01); *H01L 25/07* (2013.01); *H01L 25/50* (2013.01); *H01L 28/00* (2013.01); *H01L 2221/68359* (2013.01); *H01L 2223/6677* (2013.01); *H01L 2224/04105* (2013.01); *H01L 2224/12105* (2013.01); *H01L 2224/16227* (2013.01); *H01L 2224/32225* (2013.01); *H01L 2224/73204* (2013.01); *H01L 2224/92125* (2013.01); *H01L 2924/15311* (2013.01); *H01L 2924/15313* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01)

(56) References Cited

U.S. PATENT DOCUMENTS

| | | | |
|---|---|---|---|
| 8,339,233 B2* | 12/2012 | Tsai | H01F 17/0013 336/200 |
| 8,665,479 B2* | 3/2014 | Tan | B29C 67/0088 358/1.15 |
| 9,087,636 B2* | 7/2015 | Kostelnik | H01F 27/2804 |
| 2002/0112963 A1* | 8/2002 | Nakano | C25D 5/02 205/118 |
| 2003/0140489 A1 | 7/2003 | Kishimoto et al. | |
| 2006/0022379 A1* | 2/2006 | Wicker | B29C 67/0066 264/255 |
| 2014/0117473 A1* | 5/2014 | Kierse | H04R 1/02 257/416 |
| 2014/0152383 A1 | 6/2014 | Nikonov et al. | |
| 2014/0175625 A1 | 6/2014 | Meyer et al. | |
| 2014/0231266 A1 | 8/2014 | Sherrer et al. | |
| 2014/0240071 A1* | 8/2014 | Alderton | H01F 17/0013 336/200 |
| 2015/0352788 A1* | 12/2015 | Livingston | B65D 11/20 264/401 |
| 2016/0007462 A1* | 1/2016 | Culp | H05K 1/16 361/765 |
| 2016/0172099 A1* | 6/2016 | Panat | B22F 3/1055 336/200 |
| 2016/0295703 A1* | 10/2016 | Bobbitt, III | H01R 43/00 |
| 2016/0346998 A1* | 12/2016 | Mark | B29C 70/20 |

OTHER PUBLICATIONS

Intel Corporation, International search report and written opinion for PCT/US2014/069361, (Aug. 31, 2015).

* cited by examiner

THREE DIMENSIONAL STRUCTURES
WITHIN MOLD COMPOUND

CROSS-REFERENCE TO RELATED APPLICATION

This patent application is a U.S. National Phase Application under 35 U.S.C. §371 of International Application No. PCT/US2014/069361, filed Dec. 9, 2014, entitled THREE-DIMENSIONAL STRUCTURES WITHIN MOLD COMPOUND.

BACKGROUND

Field

Integrated circuit packaging.

Description of Related Art

Demands for higher levels of integration and lower cost drive the integration of components such as system in package "SiP" solutions. Decreases in size and cost and increases in functionality are principle drivers in this regard.

BRIEF DESCRIPTION OF THE DRAWINGS

FIG. 18 shows a package structure integrating an integrated circuit chip and passive coils in a vertical multiple wound coil configuration having a core of a magnetic material there through and coils in a horizontal multiple wound coil configuration having a magnetic core here through.

DETAILED DESCRIPTION

A method of integrating passive components and an active circuit component such as an integrated circuit chip or chips in a package is described. An active circuit component is any type of circuit component with an ability to electrically control electron flow. A passive component or structure in this context is a component or structure that is not capable of controlling current by means of an electrical signal. Examples of a passive component or structure include a resistor, a capacitor, an inductor, a filter, a balun, a transceiver, a receiver and/or an interconnect, an antenna and a shield. In one embodiment, a method includes forming a passive component or structure on a substrate and introducing one or more active circuit components (e.g., one or more integrated circuit chips) on the substrate followed by the introduction of a molding compound on the at least one passive structure and the one or more active components. In one embodiment, the forming of the passive structure on a substrate is through a build up process or additive process. Representatively, a three-dimensional additive process (e.g., three-dimensional printing process) is used to generate passive structures. Representative of a three-dimensional additive process is a selective melting or sintering processes such as selective laser melting systems or a stereolithography process where, for example, a liquid photopolymer is exposed to electromagnetic energy to selectively solidify the liquid. By building passive structures in a build up or additive process (e.g., layer-by-layer) before or during a packaging process, simple or complex three-dimensional structures like coils, antennas, resistors, or shields can be created. In addition, an entire package volume can be used to place and create additional components which enlarge the functionality and/or the performance of a package module. By employing a method that makes an entire package volume available for active and passive structures, it is further possible to improve the electrical properties of the passive structures in a way that two-dimensional passive structures could not achieve. Finally, by implementing passive components or structures within a complete volume of a package, the footprint of the package can comparatively be made smaller relative to a package with such passive structures mounted side-by-side on a printed circuit board.

Figure 1:
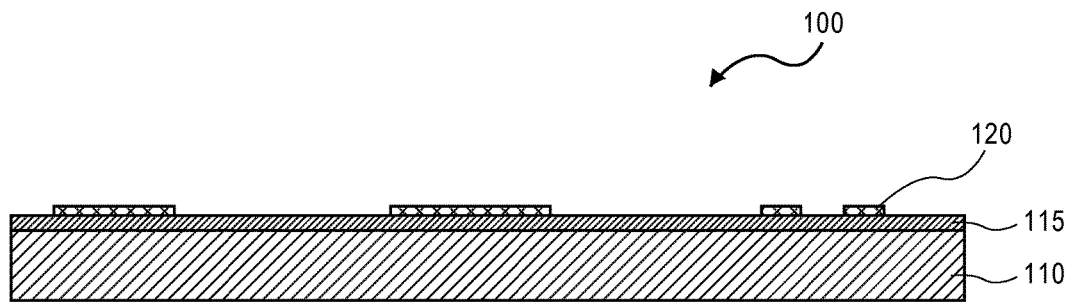
FIG. 1 shows a cross-sectional side view of a sacrificial carrier including an adhesive layer and contact points on the adhesive layer.

FIGS. 1-6 illustrate an embodiment of a process flow for the generation of a package including the integration of at least one passive structure and one or more active circuit components (e.g., one or more integrated circuit chips) embedded in a volume of a package. The process flow, in this embodiment, employs a fan-out wafer level bonding technique and the passive structure embedded in the ultimate package is a coil. FIG. 1 shows a cross-sectional side view of a sacrificial carrier. Carrier 110 is, for example, a metal, polymer or ceramic material having a representative thickness sufficient to provide functionality for the next process operations (e.g., a thickness on the order of millimeters). Disposed on a surface of carrier 110 of structure 100 (an upper surface as viewed) is adhesive layer 115. In one embodiment, adhesive layer 115 is a double-sided adhesive foil laminated to carrier 110. Disposed on adhesive layer 115, in one embodiment, are optional contact points such as metal pads/landings for devices to be formed on the structure.

Figure 2:
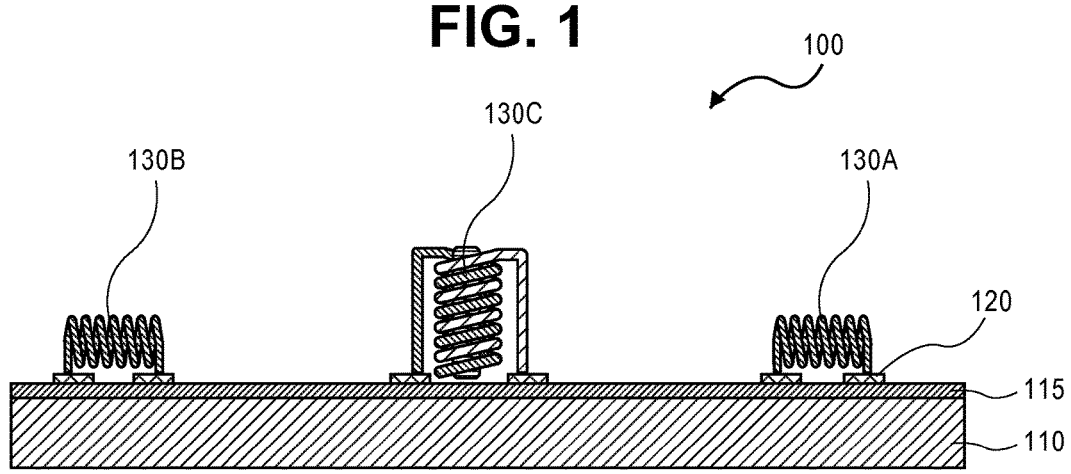
FIG. 2 shows the structure of FIG. 1 following the formation of the passive structures on the adhesive layer and connected to the contact points.

FIG. 2 shows the structure of FIG. 1 following the formation of passive structures on adhesive layer 115 and, in this embodiment, connected to contact points 120. In one embodiment, passive structure 130A, passive structure 130B and passive structure 130C are each three-dimensional passive structures formed by a build-up or additive process (e.g., a three-dimensional printing process). FIG. 2 shows passive structure 130A and passive structure 130B as horizontally disposed coils and passive structure 130C is a vertically disposed coil. It is appreciated that coils are one example of a structure that may be built by a build-up or additive process such the 3D printing process. Other structures include other passive structures that are contemplated.

Figure 3:
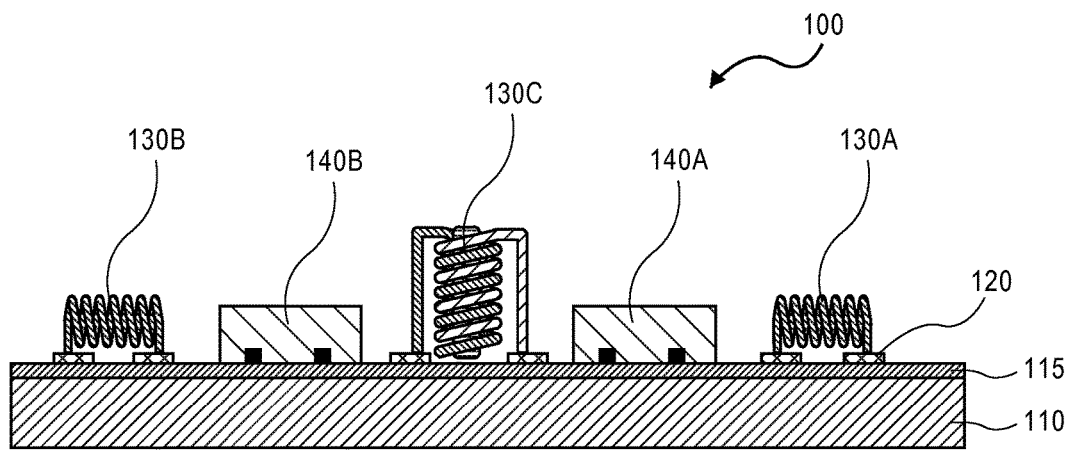
FIG. 3 shows the structure of FIG. 2 following the introduction of two integrated circuit chips on the adhesive layer.

FIG. 3 shows the structure of FIG. 2 following the introduction of two integrated circuit chips to the structure. FIG. 3 shows integrated circuit chip 140A and integrated circuit chip 140B attached to adhesive layer 115. Integrated circuit chip 140A and integrated circuit chip 140B are disposed on areas of adhesive layer 115 not occupied by (e.g., between) passive structures 130A-130C. FIG. 3 specifically shows integrated circuit chip 140A disposed between passive structure 130A and passive structure 130C and integrated circuit chip 140B disposed between integrated circuit chip 130B and integrated circuit chip 130C. In one embodiment, each of integrated circuit chip 140A and integrated circuit chip 140B are disposed with a device side toward adhesive layer 115 (device side down as viewed). In another embodiment, multiple chips or die can be placed between the passive structures 130A and 130B and/or 130B and 130C.

Figure 4:
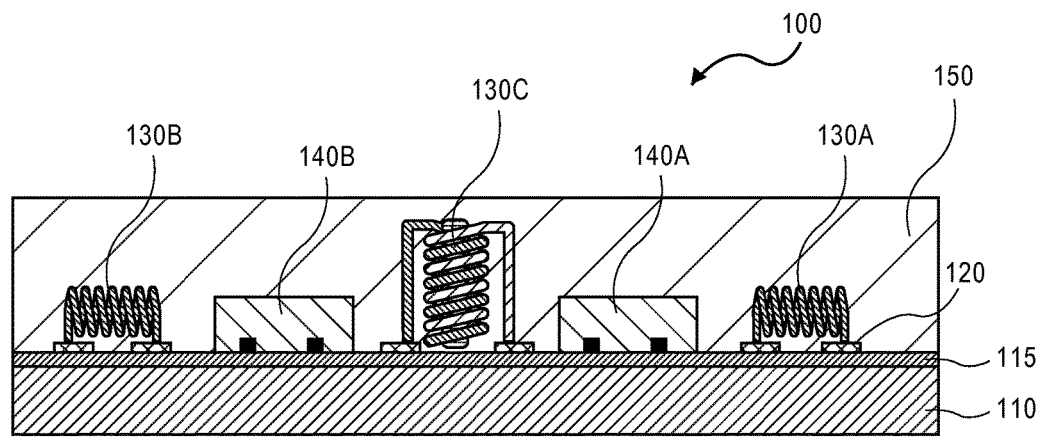
FIG. 4 shows the structure of FIG. 3 following the introduction of a molding material on the adhesive layer to embed the passive structures and the integrated circuit chips.

FIG. 4 shows the structure of FIG. 3 following the introduction of a molding material on the adhesive layer to embed the passive structures and the integrated circuit chips thereon. FIG. 4 shows molding material 150 disposed on adhesive layer 115 and introduced to a thickness to embed passive structures 130A-130C and integrated circuit chip 140A-140B. In one embodiment, a suitable material for molding material 150 is a mold compound such as KE-G1250FC-20CU or a filled epoxy based mold compound.

Figure 5:
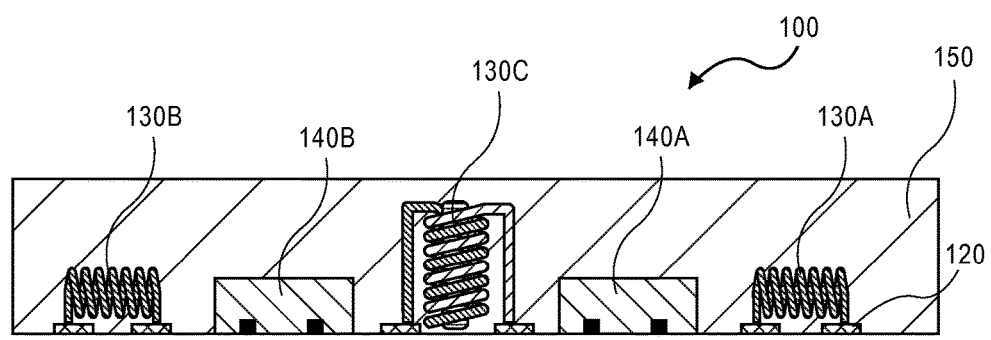
FIG. 5 shows the structure of FIG. 4 following the release of the structures embedded in molding material from the carrier.

FIG. 5 shows the structure of FIG. 4 following the release of the structures embedded in molding material 150 from the carrier. In one embodiment, the carrier is released (separated) by the addition of thermal, chemical or any other form of energy. FIG. 5 shows structure 100 including passive structures 130A-130C and integrated circuit chips 140A-140B embedded in molding material 150 following the release of substrate 110 and adhesive layer 115.

Figure 6:
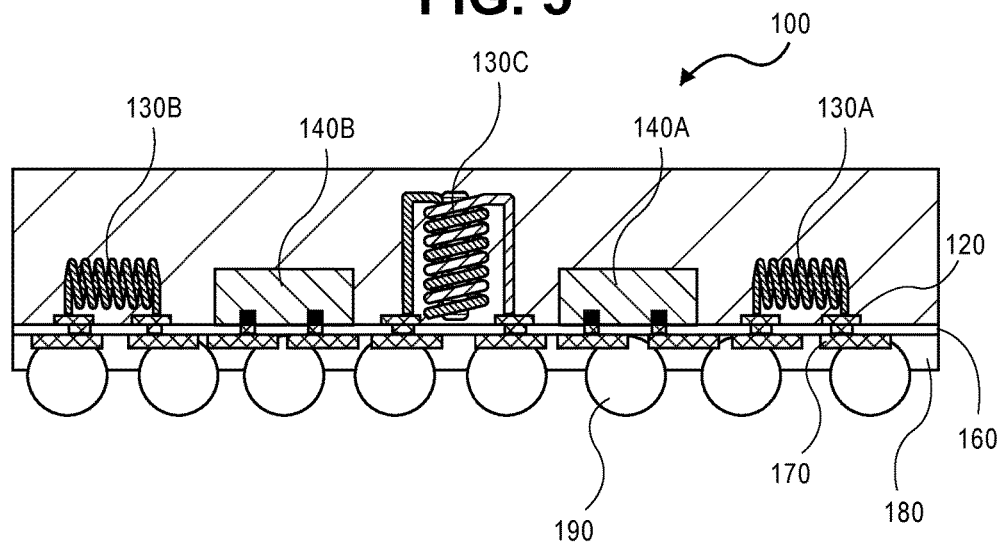
FIG. 6 shows the structure of FIG. 5 following additional wafer level processing to include a metallization layer and contact points and placement of solder connections on the contact points.

FIG. 6 shows the structure of FIG. 5 following additional wafer level processing. Such processing includes, representatively, cleaning the exposed surface (the surface exposed by the release of carrier 110; introduction of dielectric layer 160 of, for example, polyimide, epoxy, polybenzoxazole, blends or similar materials; forming openings or vias to contact points of the chips or passive structures; seeding and plating and patterning redistribution layer 170 and introduction of solder stop material 180. FIG. 6 also shows solder connections (solder balls) printed or placed as preformed balls to contact points of redistribution layer 190.

Figure 7:
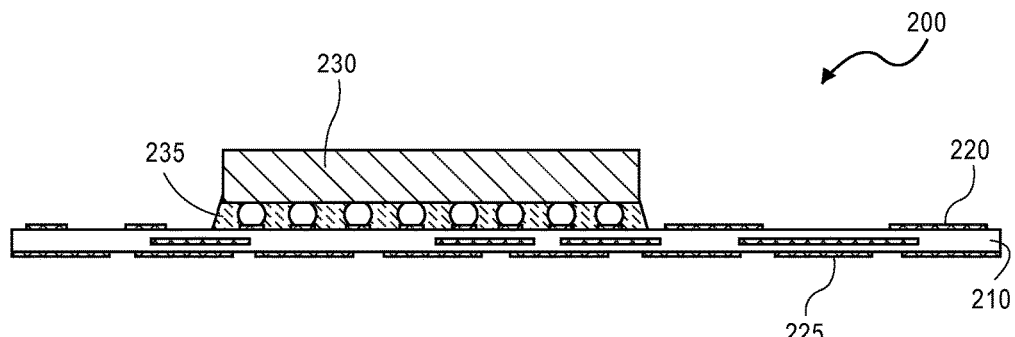
FIG. 7 shows an integrated circuit chip connected to contact points on a substrate in a flip chip configuration.

FIGS. 7-12 show an embodiment of a process flow for the incorporation of three-dimensional passive structures with one or integrated circuit chips for a flip chip package. FIG. 7 shows an integrated circuit chip such as a microprocessor connected to contact points or of a substrate (package or board) in a flip chip configuration. Structure 200 includes substrate 210 that is, for example, a coreless or a substrate with a core structure, but can also be a molded interconnect substrate (MIS) or a ceramic substrate. Substrate 210 includes contact points 220 on a first side and contact points 225 on an opposite second side. Disposed on substrate 210 and in contact with contact points 220 is integrated circuit chip 230. Chip 230 is connected to contact points 220 on substrate 210 through, in one embodiment, solder connections (solder bumps) or copper pillars. Such chip may be attached by mass reflow or compression bonding. In a flip chip configuration, chip 230 is attached to substrate 210 with a device side down or toward substrate 210. The connection of integrated circuit chip 230 to substrate 210 may be underfilled. FIG. 7 shows underfilled material 235 of, for example, a polymer material.

Figure 8:
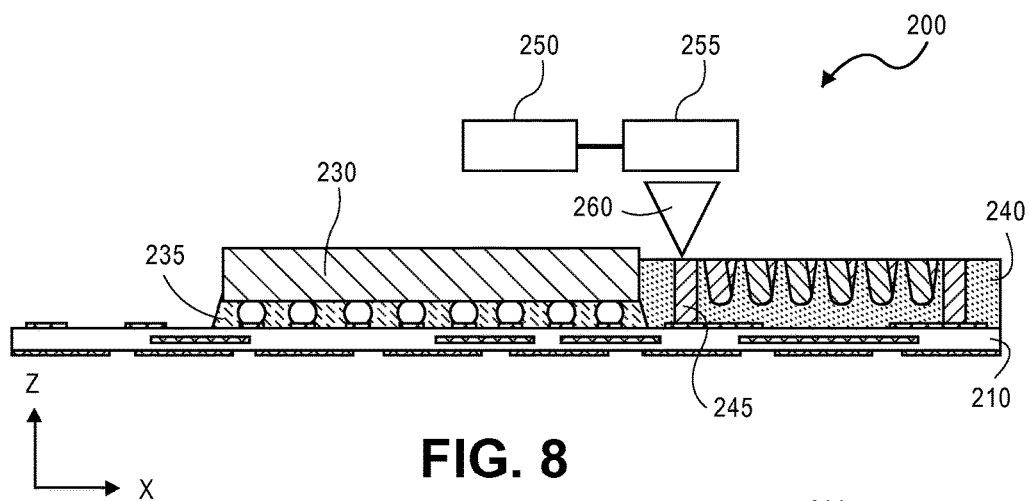
FIG. 8 shows the structure of FIG. 7 following the introduction of powder material on the substrate and a build-up or additive process of forming a passive structure.

FIG. 8 shows the structure of FIG. 7 following the introduction of powder material on substrate 210 in an area adjacent integrated circuit chip 203 and a build-up or additive process of forming a passive structure. Referring to FIG. 8, in one embodiment, a passive structure is formed by successively introducing a powder material (material particles) and using selective electromagnetic radiation melting principles to heat the powder and melt (sinter) the powder where desired. FIG. 8 shows powder 240 that is introduced on substrate 210 one layer at a time. Representatively, such introduction may be done by displacing powder (e.g., electrically conductive particles) from a powder source with a roller aligned with a surface of substrate 210. Once one layer of powder is introduced, an electromagnetic source is activated and electromagnetic radiation imparted onto the powder where desired. FIG. 8 shows electromagnetic source 250 including scanner 255 imparting electromagnetic radiation 260 onto desired particles of powder material 240. Scanner 255, in one embodiment, is controlled by a controller including non-transitory machine readable instructions that when executed cause the movement of scanner 255 in at least a two-dimensional plane (x- and y-direction) over an area of substrate 210 containing the powder and to impact electromagnetic radiation at predetermined locations.

Figure 9:
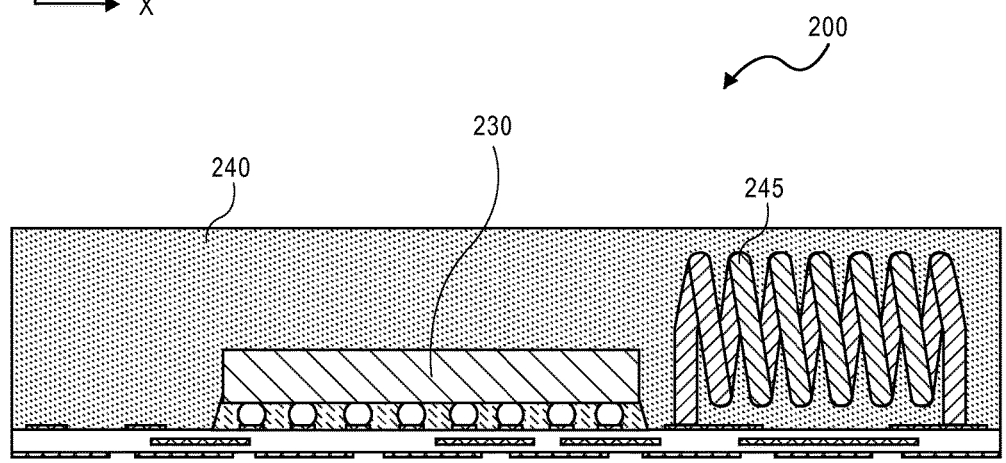
FIG. 9 shows the structure of FIG. 8 following the completion of a passive structure by an additive or build-up process.

FIG. 9 shows the structure of FIG. 8 following the completion of the introduction and melting of powder 240 to form a passive structure. FIG. 9 shows passive structure 245 of a horizontal coil. As illustrated in FIG. 9, the horizontal coil and integrated circuit chip 230 are embedded or surrounded by powder 240.

Figure 10:
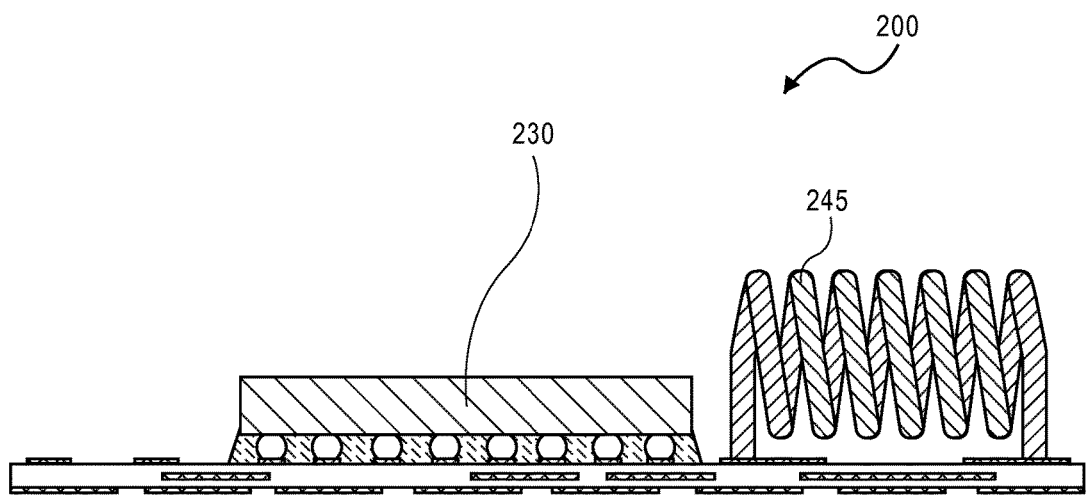
FIG. 10 shows the structure of FIG. 9 following the removal of the powder that was not melted by electromagnetic radiation to form the passive structure.
Figure 11:
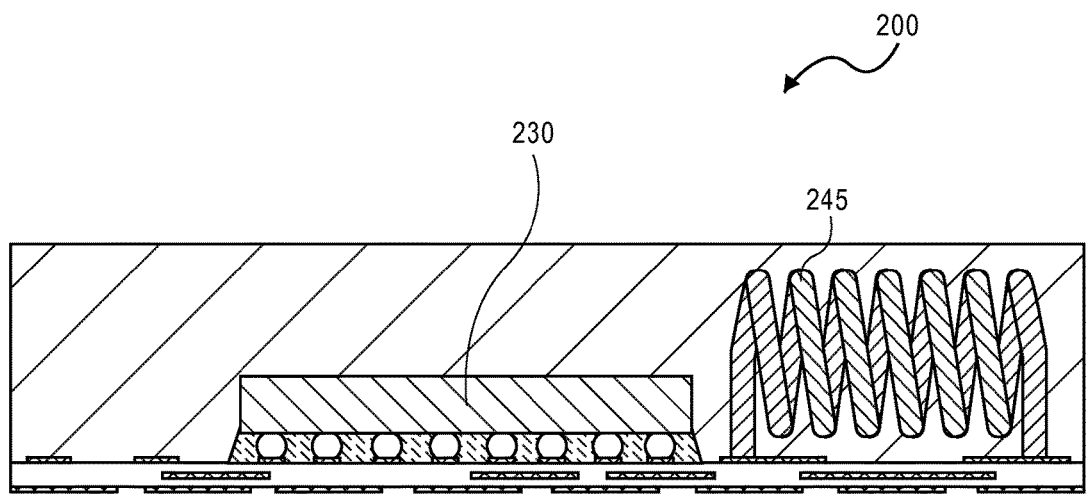
FIG. 11 shows the structure of FIG. 10 following the introduction of molding material onto a surface of substrate to embed the integrated circuit chip and the passive structure in the molding material.

FIG. 10 shows the structure of FIG. 9 following the removal of powder 240 that was not melted by electromagnetic radiation to form the passive structure. FIG. 10 shows passive structure 245 of a horizontal coil disposed on substrate 210 and connected to contact points 220 on a surface thereof (electrically connected to substrate 210). FIG. 11 shows the structure of FIG. 10 following the introduction of molding or glob top material onto a surface of substrate 210 to embed integrated circuit chip 230 and passive structure 245 in the molding material.

Figure 12:
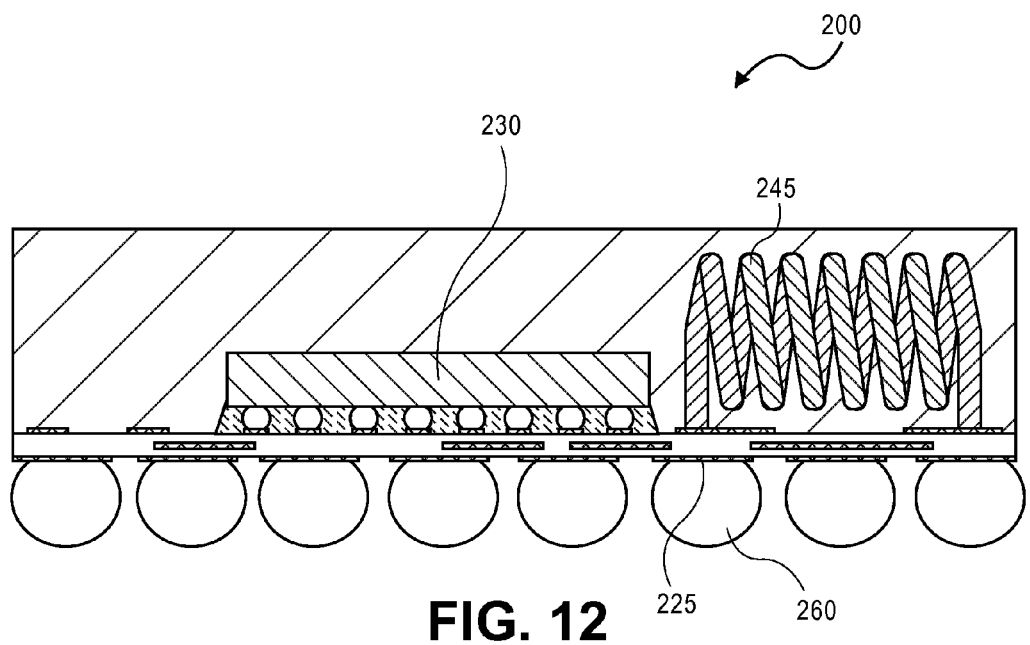
FIG. 12 shows the structure of FIG. 11 following the introduction of solder connections to the contact points on a second side of the substrate.

FIG. 12 shows the structure of FIG. 11 following the introduction of solder connections to contact points 225 on a second side of substrate 210. FIG. 12 shows solder connections (solder bumps) 260 connected to contact points 225.

In the above embodiment, a passive structure was formed on a package substrate following the introduction or placement of a chip on the substrate. In another embodiment, the passive structure may be formed prior to the placement or introduction of a chip onto a package substrate.

Figure 13:
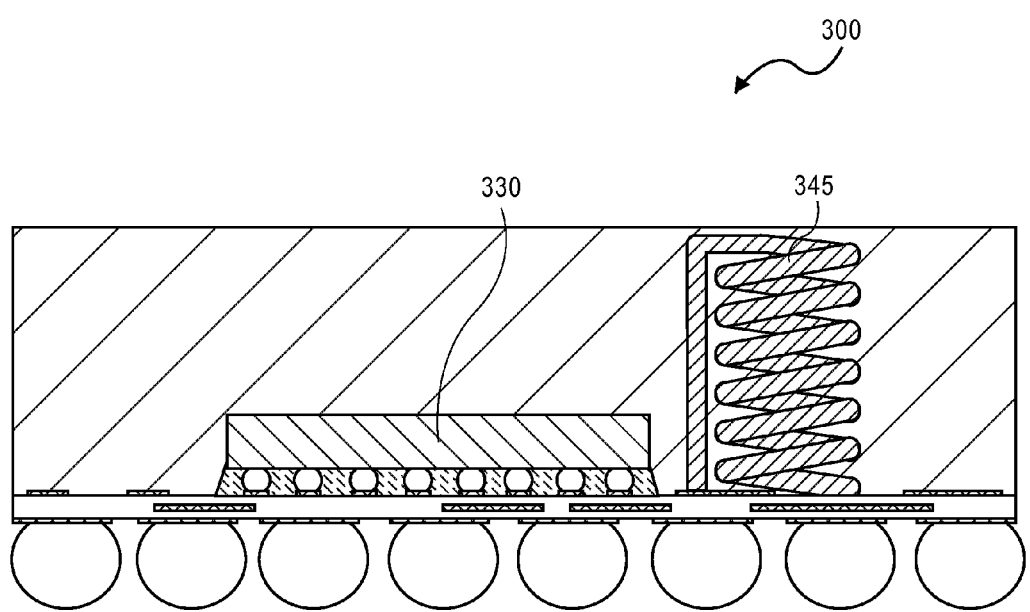
FIG. 13 shows a package integrating an integrated circuit chip and a passive structure of a vertical coil.
Figure 14:
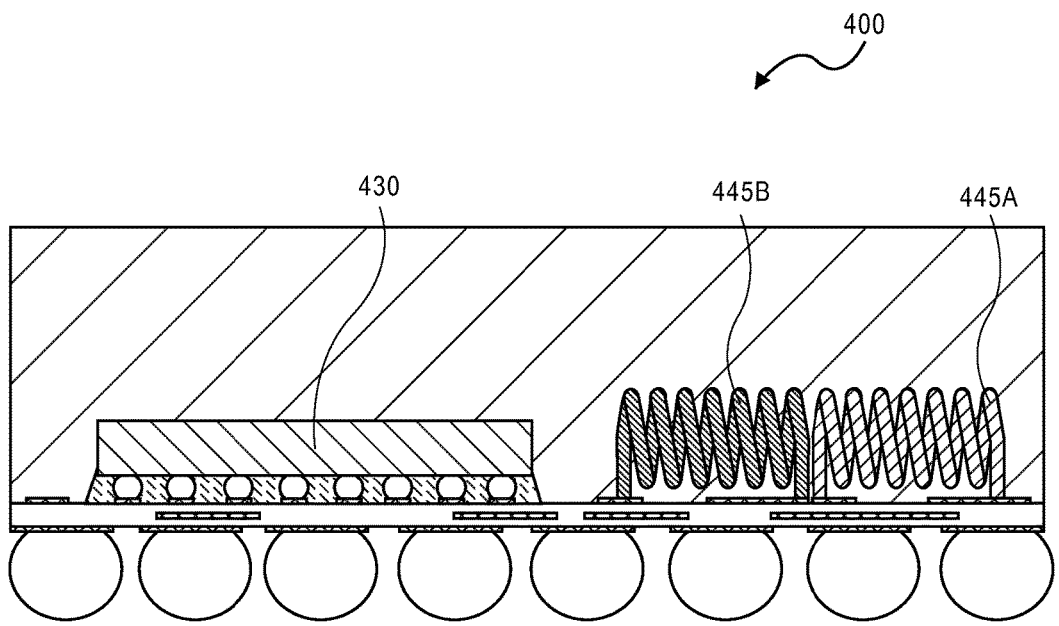
FIG. 14 shows a package structure integrating an integrated circuit chip and coils in a multi-coil configuration in side-by-side multi-coil.
Figure 15:
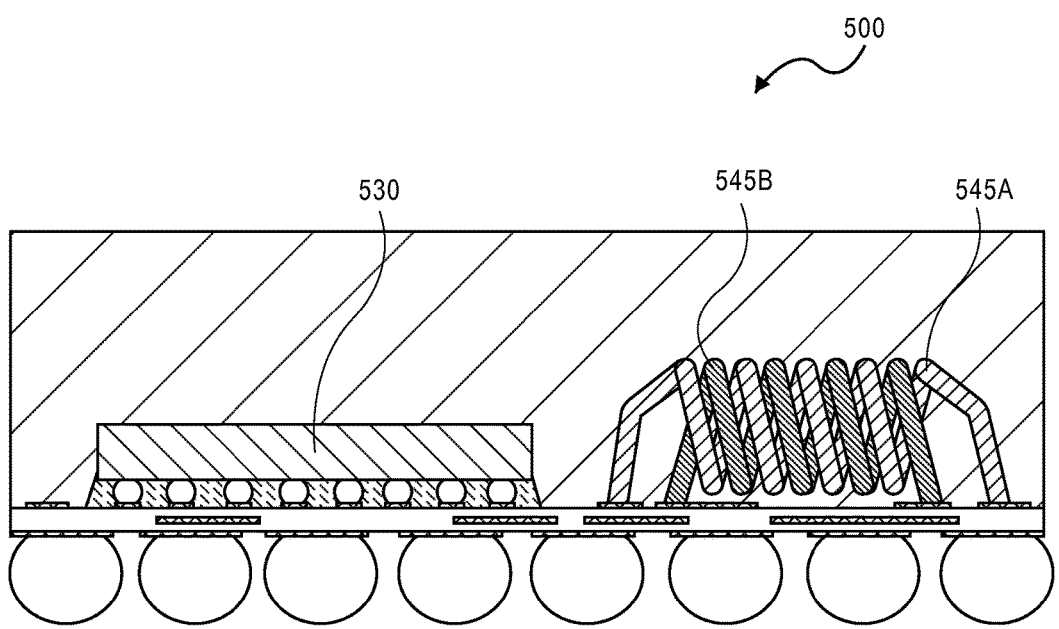
FIG. 15 shows a package substrate an integrated circuit chip and coils in a multiple wound coil horizontal configuration.
Figure 16:
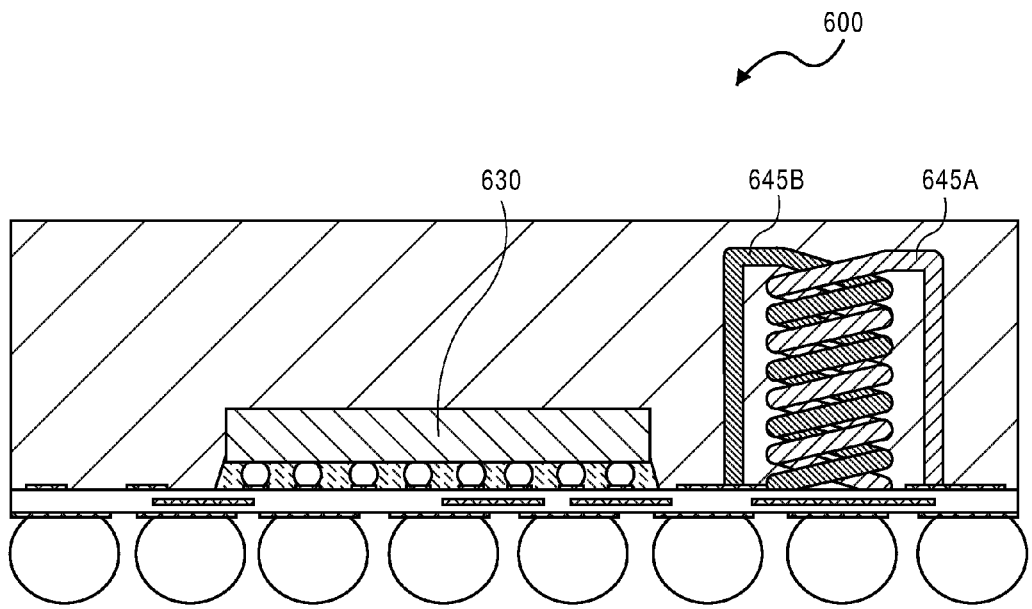
FIG. 16 shows a package structure multiple wound coil vertical configuration.

FIGS. 13-21 show different embodiments of passive structures integrated into a package with one or more integrated circuit chips. A flip chip package is used as an exemplary embodiment to illustrate the various passive structures. FIG. 13 shows package 300 integrating integrated circuit chip 330 and passive structure 345 of a vertical coil. FIG. 14 shows package structure 400 integrating integrated circuit chip 430 and coil 445A and 445B in a multi-coil configuration in a side-by-side multi-coil configuration. FIG. 15 shows package substrate 500 integrating integrated circuit chip 530 and coil 545A and coil 545B in a multiple wound coil horizontal configuration. FIG. 16 shows package structure 600 integrating integrated circuit chip 630 and coil 645A and coil 645B in a multiple wound coil vertical configuration.

Figure 17:
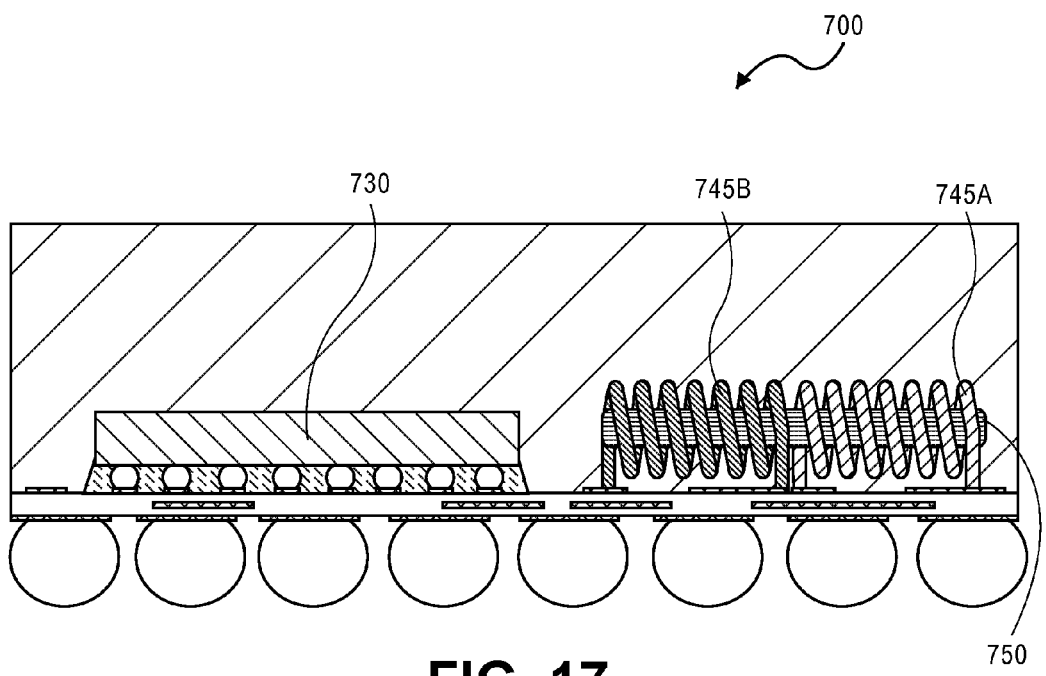
FIG. 17 shows a package structure integrating an integrated circuit chip with passive coils in a side-by-side multi-coil configuration with a core of, for example, a magnetic material disposed between the coils.
Figure 18:
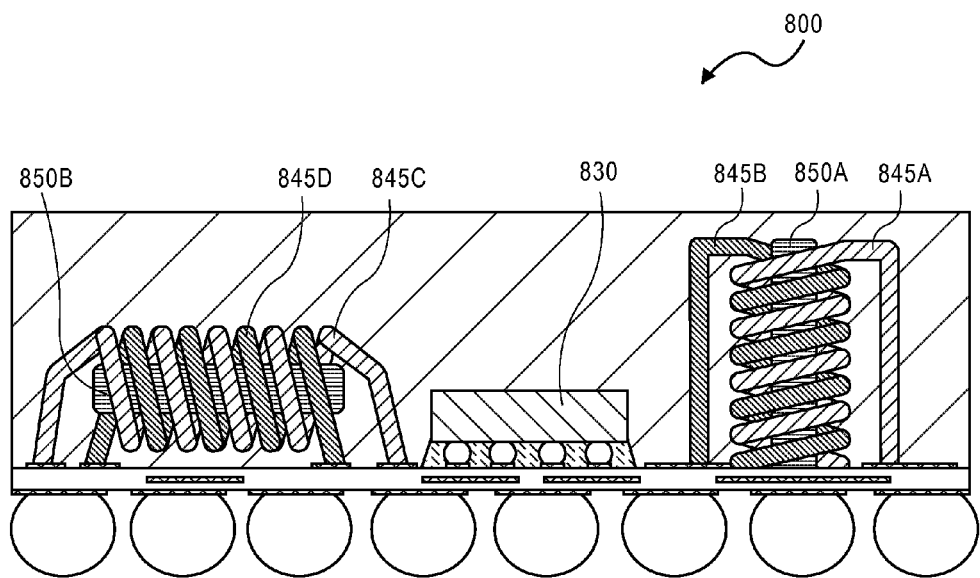

FIG. 17 shows package structure 700 integrating integrated circuit chip 730 with passive coil 745A and passive coil 745B in a side-by-side multi-coil configuration with core 750 of, for example, a magnetic material disposed between the coils. FIG. 18 shows package structure 800 integrating integrated circuit chip 830 and passive coil 845A and passive coil 845B in a vertical multiple wound coil configuration having core 850A of a magnetic material therethrough and coil 845C and coil 845D in a horizontal multiple wound coil configuration having magnetic core 850B therethrough.

Figure 19:
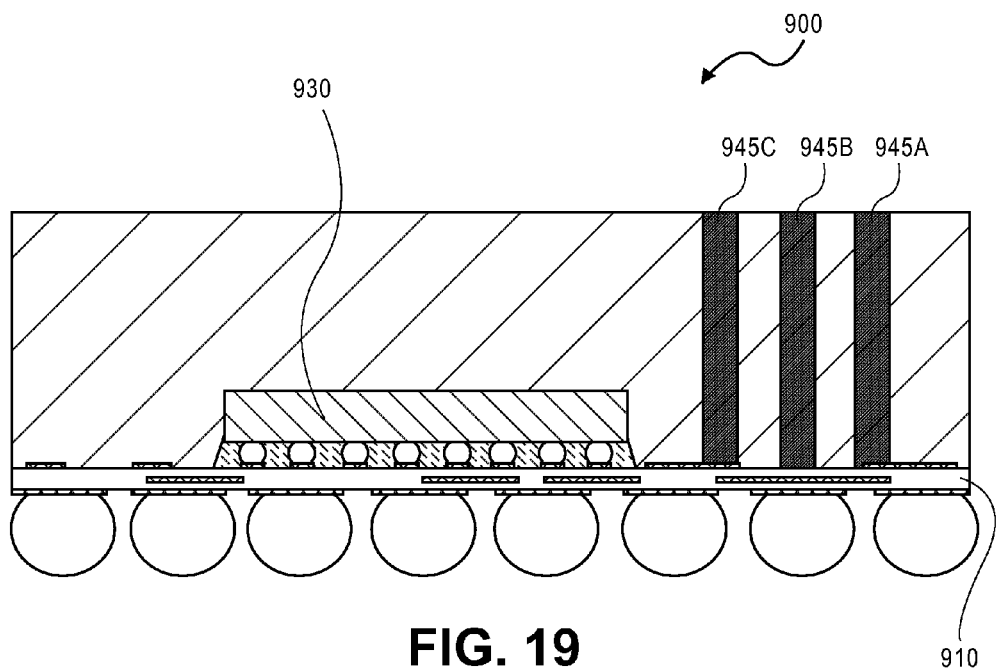
FIG. 19 shows a package substrate integrating an integrated circuit chip and passive structures each of an interconnect, notably a through mold conductive via of, for example, a copper material.

FIG. 19 shows package substrate 900 integrating integrated circuit chip 930 and passive structure 945A, passive structure 945B and passive structure 945C each of an interconnect, notably a through mold conductive via of, for example, a copper material. Such through mold vias may individually be connected to contact points on substrate 910.

Figure 20:
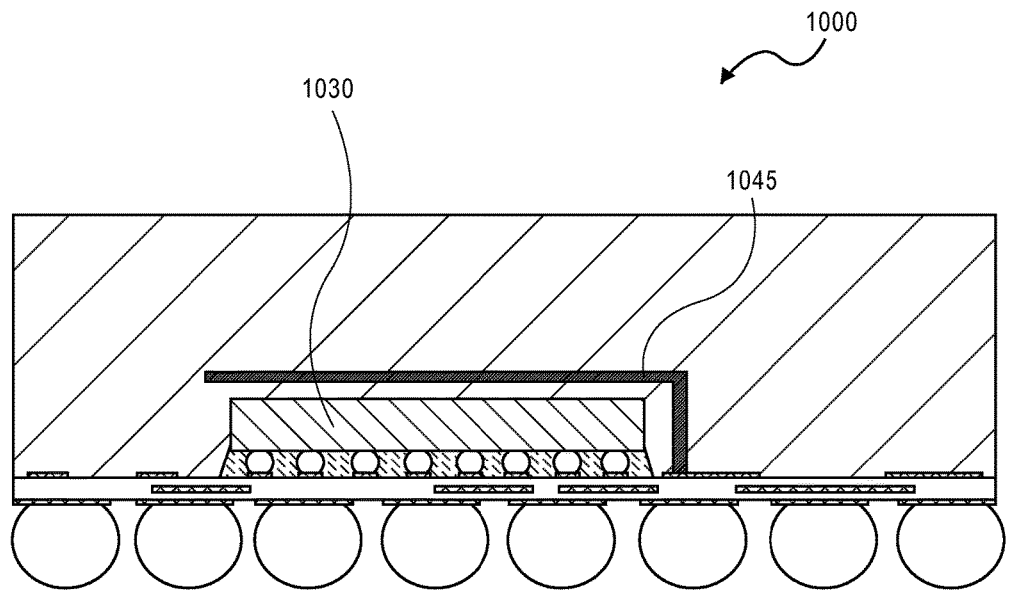
FIG. 20 shows a package substrate integrating an integrated circuit chip with a passive structure of a grounded shield.

FIG. 20 shows package substrate 1000 integrating integrated circuit chip 1030 with passive structure 1045 of a grounded shield.

Figure 21:
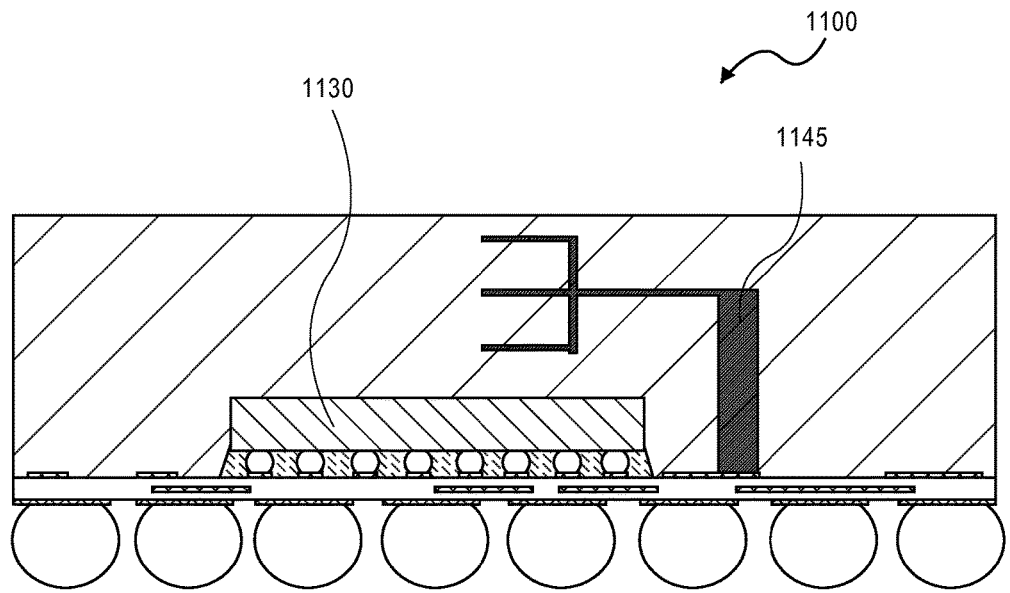
FIG. 21 shows a package substrate integrating an integrated circuit chip with a passive structure of an antenna.

FIG. 21 shows package substrate 1100 integrating integrated circuit chip 1130 with passive structure 1145 of an antenna.

Figure 22:
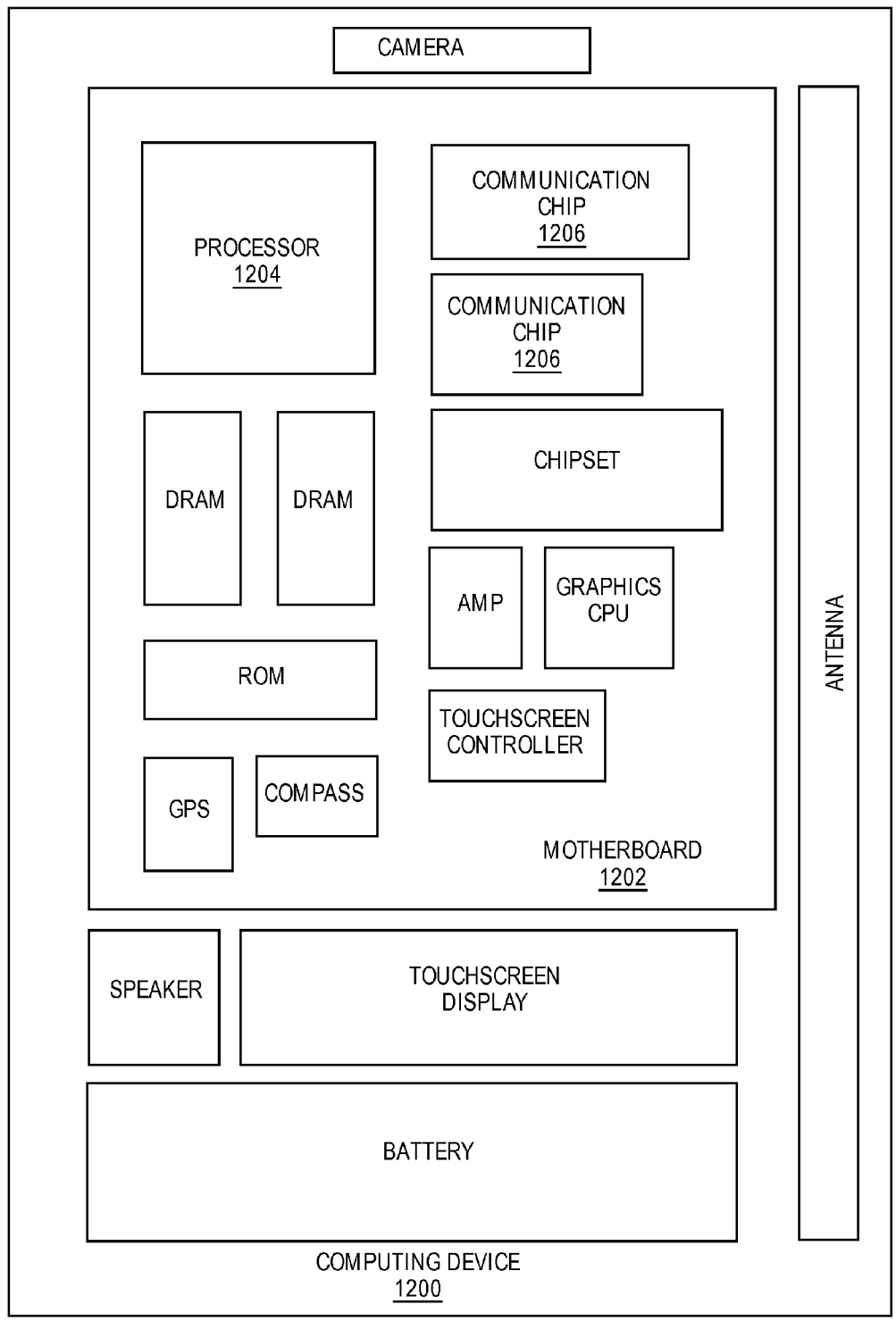
FIG. 22 illustrates an embodiment of a computing device.

FIG. 22 illustrates computing device 1200 in accordance with one implementation. Computing device 1200 houses board 1202. Board 1202 may include a number of components, including but not limited to processor 1204 and at least one communication chip 1206. Processor 1204 is physically and electrically coupled to board 1202. In some implementations at least one communication chip 1206 is also physically and electrically coupled to board 1202. In further implementations, communication chip 1206 is part of processor 1204.

Depending on its applications, computing device 1200 may include other components that may or may not be physically and electrically coupled to board 1202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 1206 enables wireless communications for the transfer of data to and from computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1200 may include a plurality of communication chips 1206. For instance, first communication chip 1206 may be dedicated to shorter range wireless communications such as Wi-Fi and Bluetooth and second communication chip 1206 may be dedicated to longer range wireless communications such as GPS, EDGE, GPRS, CDMA, WiMAX, LTE, Ev-DO, and others.

Processor 1204 of computing device 1200 includes an integrated circuit die packaged within processor 1204. The term "processor" may refer to any device or portion of a device that processes electronic data from registers and/or memory to transform that electronic data into other electronic data that may be stored in registers and/or memory. In some implementations, an integrated circuit die may be integrated with a passive structure in a package in accordance with the teachings described above.

Communication chip 1206 also includes an integrated circuit die packaged within communication chip 1206. In some implementations, an integrated circuit die may be integrated with a passive structure in a package in accordance with the teachings described above.

In further implementations, another component housed within computing device 1200 may contain an integrated circuit die that includes one or more devices, such as transistors or metal interconnects. In some implementations, an integrated circuit die may be integrated with a passive structure in a package in accordance with the teachings described above.

In various implementations, computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 1200 may be any other electronic device that processes data.

EXAMPLES

Example 1 is a method including forming at least one passive structure on a substrate by a build-up process;

introducing one or more integrated circuit chips on the substrate; and introducing a molding compound on the at least one passive structure and the one or more integrated circuit chips.

In Example 2, the substrate in the method of Example 1 includes a sacrificial substrate and after introducing the molding compound, the method comprises removing the sacrificial substrate.

In Example 3, each of the at least one passive structure and the one or more integrated circuit chips in the method of Example 2 include contact points and removing the sacrificial substrate exposes the contact points, the method further including coupling a redistribution layer to the contact points.

In Example 4, introducing the one or more chips in the method of Example 1 includes coupling contact points of the one or more chips to contact points of the substrate.

In Example 5, one or more chips in the method of Example 4 are coupled to the substrate through solder connections.

In Example 6, forming the at least one passive structure on the substrate in the method of Example 4 includes coupling the at least one passive structure to respective one or more contact points of the substrate.

In Example 7, the build-up process in the method of Example 1 includes repeatedly depositing a layer of conductive powder on the substrate and selectively melting the conductive powder in the deposited layer.

In Example 8, the build-up process in the method of Example 1 includes stereo lithography.

In Example 9, the at least one passive structure in the method of Example 1 includes a coil.

In Example 10, the at least one passive structure in the method of Example 1 includes at least one of an antenna, a resistor or a shield.

In Example 11, a package substrate is made by any of the methods of Examples 1-10.

Example 12 is a method including forming at least one passive structure on a substrate by a three-dimensional printing process; introducing one or more integrated circuit chips on the substrate; and embedding the at least one passive structure and the one or more integrated circuit chips in a molding compound.

In Example 13, the substrate in the method of Example 12 includes a sacrificial substrate and after embedding the at least one passive structure and the one or more integrated circuits in the molding compound, the method comprises removing the sacrificial substrate.

In Example 14, each of the at least one passive structure and the one or more integrated circuit chips in the method of Example 13 includes contact points and removing the sacrificial substrate exposes the contact points, the method further including coupling a metallization layer to the contact points.

In Example 15, introducing the one or more chips in the method of Example 12 includes coupling contact points of the one or more chips to contact points of the substrate.

In Example 16, the one or more chips in the method of Example 15 are coupled to the substrate through solder connections.

In Example 17, forming the at least one passive structure on the substrate in the method of Example 15 includes coupling the at least one passive structure to respective one or more contact points of the substrate.

In Example 18, the three-dimensional printing process in the method of Example 12 includes repeatedly depositing a layer of conductive powder on the substrate and selectively melting the conductive powder in the deposited layer.

In Example 19, the build-up process in the method of Example 12 includes stereo lithography.

In Example 20, a package substrate is made by any of the methods of Examples 12-19.

Example 21 is an apparatus including a package substrate including at least one three-dimensional printed passive structure and one or more integrated circuit chips embedded in a molding material.

In Example 22, the at least one passive structure in the apparatus of Example 21 includes at least one of an antenna, a resistor, a coil or a shield.

In Example 23, the package further in the apparatus of Example 21 includes a substrate having contact points thereon and the at least one passive structure and the one or more integrated circuit chips are coupled to respective ones of the contact points of the substrate.

In Example 24, the one or more integrated circuit chips in the apparatus in Example 23 are coupled to respective ones of the contact points of the substrate through solder connections.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made to the invention in light of the above detailed description. The terms used in the following claims should not be construed to limit the invention to the specific implementations disclosed in the specification and the claims. Rather, the scope is to be determined entirely by the following claims, which are to be construed in accordance with established doctrines of claim interpretation.

The invention claimed is:

1. A method comprising:
   forming at least one passive structure on a substrate by a build-up process;
   introducing one or more integrated circuit chips on the substrate;
   introducing a molding compound on the at least one passive structure and the one or more integrated circuit chips; and
   after introducing the molding compound, the method comprises removing the substrate.

2. The method of claim 1, wherein each of the at least one passive structure and the one or more integrated circuit chips comprise contact points and removing the substrate exposes the contact points, the method further comprising:
   coupling a redistribution layer to the contact points.

3. A method comprising:
   forming at least one passive structure on a substrate by a build-up process;
   introducing one or more integrated circuit chips on the substrate; and
   introducing a molding compound on the at least one passive structure and the one or more integrated circuit chips,
   wherein introducing the one or more chips comprises coupling contact points of the one or more chips to contact points of the substrate, and
   wherein the build-up process comprises repeatedly depositing a layer of conductive powder on the substrate and selectively melting the conductive powder in the deposited layer or the build-up process comprises stereo lithography.

4. The method of claim 3, wherein the one or more chips are coupled to the substrate through solder connections.

5. The method of claim 3, wherein forming the at least one passive structure on the substrate comprises coupling the at least one passive structure to respective one or more contact points of the substrate.

6. The method of claim 1, wherein the at least one passive structure comprises a coil.

7. The method of claim 1, wherein the at least one passive structure comprises at least one of an antenna, a resistor or a shield.

8. A package substrate is made by the method of claim 1.

9. A method comprising:
forming at least one passive structure on a substrate by a three-dimensional printing process;
introducing one or more integrated circuit chips on the substrate;
embedding the at least one passive structure and the one or more integrated circuit chips in a molding compound; and
after embedding the at least one passive structure and the one or more integrated circuits in the molding compound, the method comprises removing the substrate.

10. The method of claim 9, wherein each of the at least one passive structure and the one or more integrated circuit chips comprise contact points and removing the substrate exposes the contact points, the method further comprising:
coupling a metallization layer to the contact points.

11. A method comprising:
forming at least one passive structure on a substrate by a three-dimensional printing process;
introducing one or more integrated circuit chips on the substrate; and
embedding the at least one passive structure and the one or more integrated circuit chips in a molding compound,
wherein introducing the one or more chips comprises coupling contact points of the one or more chips to contact points of the substrate, and
wherein the three-dimensional printing process comprises repeatedly depositing a layer of conductive powder on the substrate and selectively melting the conductive powder in the deposited layer or comprises stereo lithography.

12. The method of claim 11, wherein the one or more chips are coupled to the substrate through solder connections.

13. The method of claim 11, wherein forming the at least one passive structure on the substrate comprises coupling the at least one passive structure to respective one or more contact points of the substrate.

14. A package substrate is made by the method of claim 9.

15. An apparatus comprising:
a package substrate comprising at least one three-dimensional printed passive structure and one or more integrated circuit chips embedded in a molding material, wherein the package substrate includes first contact points on a first side and second contact points on an opposite second side and wherein the one or integrated circuit chips are coupled to ones of the first contact points.

16. The apparatus of claim 15, wherein the at least one passive structure comprises at least one of an antenna, a resistor, a coil or a shield.

17. The apparatus of claim 15, wherein the at least one passive structure is coupled to other ones of the first contact points of the package substrate.

18. The apparatus of claim 15, wherein the one or more integrated circuit chips are coupled to ones of the first contact points of the substrate through solder connections.

19. The method of claim 3, wherein the at least one passive structure comprises a coil.

20. The method of claim 3, wherein the at least one passive structure comprises at least one of an antenna, a resistor or a shield.

* * * * *